US008684168B2

(12) United States Patent
Thiel et al.

(10) Patent No.: US 8,684,168 B2
(45) Date of Patent: Apr. 1, 2014

(54) HANDLER FOR ELECTRONIC COMPONENTS, IN PARTICULAR IC'S, COMPRISING A PNEUMATIC CYLINDER DISPLACEMENT UNIT FOR MOVING PLUNGERS

(75) Inventors: Stefan Thiel, Rosenheim (DE); Günther Jeserer, Tuntenhausen (DE); Andreas Wiesböck, Stephanskirchen (DE); Alexander Bauer, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 1039 days.

(21) Appl. No.: 12/526,728

(22) PCT Filed: Sep. 25, 2008

(86) PCT No.: PCT/EP2008/008152
§ 371 (c)(1),
(2), (4) Date: Aug. 11, 2009

(87) PCT Pub. No.: WO2009/046882
PCT Pub. Date: Apr. 16, 2009

(65) Prior Publication Data
US 2010/0150686 A1 Jun. 17, 2010

(30) Foreign Application Priority Data
Oct. 5, 2007 (DE) .................. 10 2007 047 678

(51) Int. Cl.
*B65G 17/46* (2006.01)

(52) U.S. Cl.
USPC ............. 198/471.1; 198/478; 198/803.5; 414/222.12; 414/223.01; 414/226.01

(58) Field of Classification Search
USPC ............ 198/471.1, 803.5, 478.1; 414/222.12, 414/222.01, 226.01
See application file for complete search history.

(56) References Cited

U.S. PATENT DOCUMENTS

| 3,881,362 | A | * | 5/1975 | Beezer ......................... 74/53 |
| 4,370,092 | A | * | 1/1983 | Healy ....................... 414/752.1 |
| 4,735,761 | A | * | 4/1988 | Lindenberger ............... 264/511 |
| 5,330,043 | A | | 7/1994 | Stuckey |
| 5,456,570 | A | * | 10/1995 | Davis et al. .................. 414/742 |
| 5,469,953 | A | | 11/1995 | Igarashi et al. |
| 5,649,804 | A | * | 7/1997 | Schychuck ............. 198/750.11 |

(Continued)

FOREIGN PATENT DOCUMENTS

| DE | 44 18 142 | 12/1994 |
| EP | 1 832 886 | 9/2007 |

(Continued)

OTHER PUBLICATIONS

Machine translation of JP 10-227834, published Aug. 25, 1998.

(Continued)

*Primary Examiner* — Joseph Dillon, Jr.
(74) *Attorney, Agent, or Firm* — Nixon & Vanderhye P.C.

(57) ABSTRACT

A handler for electronic components, in particular IC's, comprising a feed unit for plungers with a pneumatic cylinder unit that can be displaced and that is coupled to a pneumatic cylinder displacement unit, which moves said cylinder unit back and forth in the axial direction of the plungers.

7 Claims, 7 Drawing Sheets

(56) References Cited

U.S. PATENT DOCUMENTS

| | | | |
|---|---|---|---|
| 5,935,330 A * | 8/1999 | Taniguchi | 118/66 |
| 5,957,305 A | 9/1999 | Takahashi | |
| 6,031,384 A | 2/2000 | Furuta | |
| 6,098,785 A * | 8/2000 | Van Maanen | 198/459.8 |
| 6,209,194 B1 | 4/2001 | Kang et al. | |
| 6,336,548 B1 * | 1/2002 | Asai et al. | 198/468.4 |
| 6,942,086 B2 * | 9/2005 | Bridges et al. | 198/377.08 |
| 7,004,522 B2 * | 2/2006 | Nagai et al. | 294/185 |
| 7,621,390 B2 * | 11/2009 | Ansaloni | 198/441 |
| 7,648,017 B2 * | 1/2010 | Furlotti | 198/377.08 |
| 7,673,520 B2 * | 3/2010 | Langer et al. | 73/763 |
| 8,297,433 B2 * | 10/2012 | Thiel et al. | 198/471.1 |
| 2003/0147736 A1 | 8/2003 | Nagai et al. | |
| 2007/0212201 A1 | 9/2007 | Langer et al. | |
| 2008/0059095 A1 | 3/2008 | Ichikawa | |
| 2008/0074118 A1 | 3/2008 | Masuo | |
| 2010/0219044 A1 * | 9/2010 | Thiel et al. | 198/471.1 |
| 2011/0315512 A1 * | 12/2011 | Serpa | 198/471.1 |
| 2013/0115029 A1 * | 5/2013 | Guercioni | 414/222.04 |

FOREIGN PATENT DOCUMENTS

| | | |
|---|---|---|
| JP | 9089983 | 4/1997 |
| JP | 10227834 | 8/1998 |
| JP | 2001208797 | 8/2001 |
| WO | WO 2006/059553 | 6/2006 |
| WO | WO 2006/114836 | 11/2006 |

OTHER PUBLICATIONS

International Search Report for PCT/EP2008/008152, mailed Apr. 6, 2009.

* cited by examiner

HANDLER FOR ELECTRONIC COMPONENTS, IN PARTICULAR IC'S, COMPRISING A PNEUMATIC CYLINDER DISPLACEMENT UNIT FOR MOVING PLUNGERS

This application is the U.S. national phase of International Application No. PCT/EP2008/008152 filed 25 Sep. 2008, which designated the U.S. and claims priority to Germany Application No. 10 2007 047 678.9 filed 5 Oct. 2007, the entire contents of each of which are hereby incorporated by reference.

The invention relates to a handling device for electronic components, in particular ICs, comprising at least one transport unit for transporting components to be tested into a position, in which the components oppose contact mechanisms of a test device, and comprising an advancing mechanism, which is separate from the transport unit, for displacing plungers, which are arranged on the transport unit and are configured to hold the components.

Electronic components, such as ICs (semiconductor components with integrated circuits), for example, are generally checked for their functional capability before they are assembled, for example, on printed-circuit boards or used elsewhere. The components to be tested are contacted here by an automatic handling device, which is generally known as a "handler", with contact mechanisms, which are configured, in particular, as contact sockets and are in electrical contact with a test head of a test device. On ending the test process, the components are removed again by means of the handler from the contact mechanisms and sorted as a function of the test result.

To hold and contact the components, handlers generally have plungers, i.e. longitudinally displaceable holding units which can hold the components, in particular by applying a suction force by means of a vacuum. After placing the components inside the handler, the plungers are brought into a position, in which they can be advanced further toward the contact mechanisms on a linear path until the components come into contact with the contact mechanisms. After carrying out the test processes, the components are removed again from the test head by means of the plungers and positioned in such a way that that they can be removed from the handler by means of an unloading station and can be sorted as a function of the test result.

In order to be able to carry out the test process of the components in as economical a manner as possible, it is of crucial importance that the handlers work at a very high speed, i.e. that throughputs which are as high as possible are achieved.

For this purpose, a central handler unit with a cuboidal central part is already known, on which a plurality of plungers is longitudinally displaceably guided, which plungers, at their front end, hold the components by means of a vacuum. The plungers are pushed there by means of an advancing mechanism in the form of pneumatic cylinders. Although this principle has proven successful, it is difficult or very expensive to thus bring a plurality of plungers of the transport unit into the front contact position in the shortest time and in a very precise manner, and at the same time to ensure a soft, gentle contacting of the components.

The invention is based on the object of providing a handling device of the type mentioned at the outset comprising an advancing mechanism, with which a plurality of plungers, on which the components to be tested are held, can also be transferred in a relatively simple, rapid and precise manner into the front test position and a gentle contacting of the components can be achieved.

This object is achieved according to the invention by a handling device having the features of claim 1. Advantageous embodiments of the invention are described in the further claims.

In the handling device according to the invention, the pneumatic cylinder mechanism is displaceably configured and coupled to a pneumatic cylinder movement mechanism moving the pneumatic cylinder mechanism back and forth in the axial direction of the plungers.

According to the invention, the advancing mechanism for displacing the plungers consists of a combination of a displaceably arranged pneumatic cylinder mechanism and a pneumatic cylinder movement mechanism moving the pneumatic cylinder mechanism back and forth in the axial direction of the plungers. Since the pneumatic cylinders as a whole are moved back and forth by the pneumatic cylinder movement mechanism, the pneumatic cylinder movement mechanism can be configured in a targeted manner and optimised such that the required feed path can be bridged in a very rapid manner, while the pneumatic cylinders act as spring elements, which ensure soft placing of the connection contacts of the component on the contact mechanisms. As a result, on the one hand, a very rapid contacting can be achieved and, on the other hand, also a soft, gentle contacting, and this, in particular, preserves the connection contacts present at the contact mechanisms, for example contact springs. Furthermore, owing to the path which the pneumatic cylinders can compensate for with their stroke, the possibility is provided of compensating for tolerances during contacting. All the components are pressed by the same pressure against the contact mechanisms.

According to an advantageous embodiment, the pneumatic cylinder movement mechanism consists of a crankshaft mechanism, which has a drive mechanism, a crankshaft which can be made to rotate by the drive mechanism, and at least one connecting rod, which is eccentrically mounted on the crankshaft and is coupled to the pneumatic cylinder mechanism, to displace the latter in the axial direction of the plungers. A crankshaft mechanism of this type provides the advantage that by means of the latter, the plungers, on which the components are held, can be transferred from their drawn back position into their front contact position in a relatively simple, very rapid and precise manner. It is particularly advantageous here that the crankshaft mechanism allows a speed-dependent feed of the plungers, the feed speed being dependent on the angular position of the crankshaft. The connecting rod is expediently mounted on the crankshaft here in such a way that the feed speed becomes lower and lower on approaching the front contact position (end position), while the feed speed can be very high at least over the larger part of the remaining feed path. In this manner, short feed times can be achieved with simultaneously gentle contacting of the components by the contacting mechanisms (for example contact sockets).

The pneumatic cylinder movement mechanism may also consist of another movement mechanism. For example, it is possible to provide a spindle drive for this. Furthermore, it is also conceivable to likewise move the pneumatic cylinder mechanism back and forth in a pneumatic manner, for example by means of a central feed cylinder.

According to an advantageous embodiment, the pneumatic cylinder mechanism has a plate carrier and a cylinder holding plate fastened thereto, the plate carrier being displaceably guided on a guide mechanism stationarily arranged inside the handling device and the pneumatic cylinders being fastened to the cylinder holding plate. This allows a very precise guidance of the pneumatic cylinder mechanism in the feed direction and moreover facilitates assembly, as the pneumatic cylinders can be assembled in advance on the cylinder holding plate.

According to an advantageous embodiment, a pneumatic cylinder is associated with each plunger of a transport unit. As a result, each component can be cushioned on contacting, independently of other components.

According to an advantageous embodiment, a control valve for opening or closing associated pneumatic lines is provided for each pneumatic cylinder or for individual sub-groups of pneumatic cylinders, so each pneumatic cylinder or sub-groups of pneumatic cylinders can be activated individually by means of the control valves and only selected plungers can be transferred into the front test position. The possibility of disabling thus exists. If, for example, on the tester side, various contacting mechanisms fail or if all the contacting mechanisms are not to be operated, individual pneumatic cylinders can be drawn in, so the corresponding plungers are not transferred into the front contact position.

According to an advantageous embodiment, the pneumatic cylinders are configured as short-stroke cylinders and have piston rods, which are resiliently held in the cylinder housing by air pressure, the force for inserting the piston rods remaining substantially constant at least over an initial part of the insertion path. As a result, it is possible, in a particularly precise manner, to press the components, even if they or the contact mechanisms (contact sockets) have relatively large dimensional or positional tolerances, onto the contact mechanisms, in a uniform manner at the desired pressure.

The invention will be described in more detail below, by way of example, with the aid of the drawings, in which.

Figure 1:
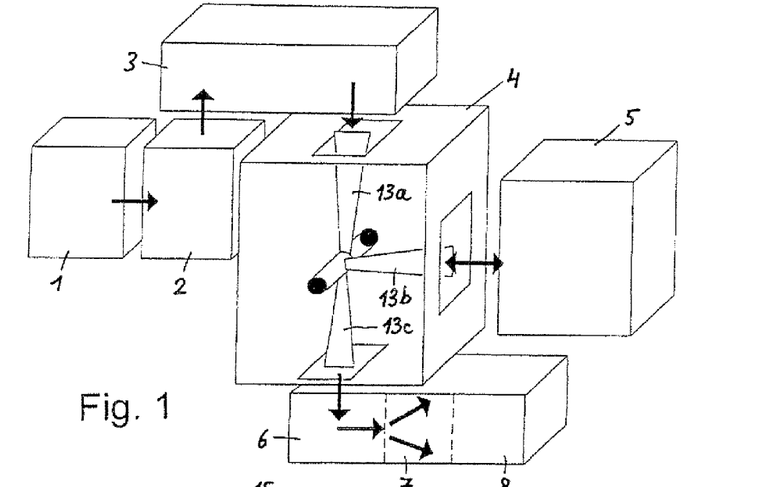
FIG. 1 shows a schematic view of the handling device according to the invention and surrounding devices or modules, which are used when testing electronic components.

A system for testing electronic components in the form of ICs (semiconductor components with integrated circuits) is first described schematically and by way of example with the aid of FIG. 1. In this case, the arrows indicate the path of the components.

The components are firstly fed to a loading unit 1. The loading unit 1 firstly transports the components to a temperature-control chamber 2 in order to adjust them to a predetermined temperature inside the temperature-control chamber 2. This may be between −60° C. and +200° C., for example. The temperature can be controlled, in this case, in a convective and/or conductive manner. Once the components to be tested have been brought to the desired temperature in the temperature-control chamber 2, they are removed from the temperature-control chamber 2 by a transport device 3, which may, for example, be a pick and place unit, and fed to a handling device 4. The handling device 4 contains the necessary mechanisms for receiving and holding the components, optionally an additional temperature control of the components and a component movement mechanism to feed the components to a test head 5 and, on ending the test process, to remove them again from the test head 5. The handling device 4 may furthermore contain specific mechanisms to act on the components to be tested in a specific manner, for example with accelerations, pressure or inclination of the components.

The test head 5 is connected in a known manner to the handling device 4. The test head 5 is part of an electronic test device, with which the components are tested and the test results are evaluated.

On ending the test, the components are removed again from the test head 5 by the handling device 4 and fed to a sorting unit 7 by means of a removal unit 6 (unloader or pick and place unit). The components are sorted as a function of the test result in the sorting unit 7. The components then arrive at an unloading station 8.

The temperature-control chamber 2 arranged outside the handling device 4 is merely optional. If the components to be tested do not have to be temperature-controlled, a temperature-control chamber 2 of this type can be dispensed with. Furthermore, it is also possible, in addition or as an alternative to the temperature-control chamber 2, to carry out the temperature-control of the components to be tested inside the handling device 4. Furthermore, the components do not have to be fed to the handling device 4 by means of the transport device 3 in the form of a pick and place unit, but, as known to the person skilled in the art, feeding can also take place by means of gravitational force. In this case, this is a so-called gravity handler.

The structure and functionality of the handling device 4 according to the invention will be described in more detail below with the aid of FIGS. 2 to 11.

Figure 2:
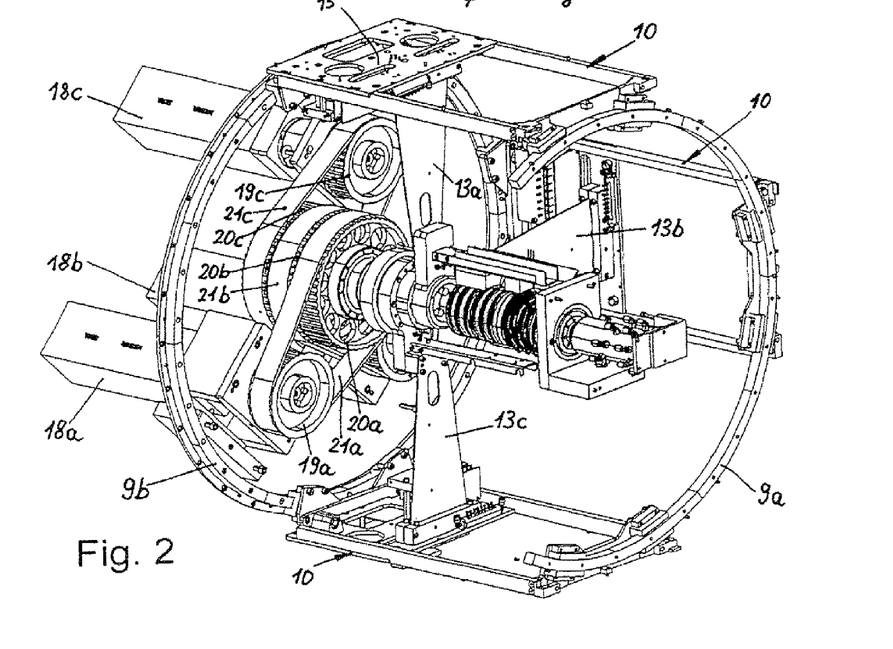
FIG. 2 shows a perspective view of a handling device with three circulating carriages shown in part, the advancing mechanism not being drawn, however.

As can be seen from FIG. 2, the handling device 4 has a guide mechanism 9 with two circular stationary guides 9a, 9b, on which three transport units in the form of circulating carriages 10 are displaceably mounted. The guides 9a, 9b extend about a common centre axis 11. The circulating carriages 10 may be guided along the guides 9a, 9b on a circular path about the horizontal centre axis 11 independently of one another, i.e. the spacing of each circulating carriage 10 from a circulating carriage 10 that is ahead or following may be varied in the direction of circulation. Depending on the purpose of the handling device 4, the number of circulating carriages 10 may vary. For example, it is possible to provide two to eight, in particular three to five, circulating carriages 10.

A plurality of identical plungers 12 with vacuum suction devices is fastened to each circulating carriage 10 and is used, in each case, to hold an electronic component 43 to be tested, for example a semiconductor component (IC). A different number of plungers 12 is drawn in part in FIGS. 3 to 7, the embodiment according to FIGS. 3, 6, 7 assuming sixteen plungers 12, which are arranged in the form of a 4×4 matrix. However, it is easily possible to provide a different number of plungers 12 on each of the circulating carriages 10, to be able to receive a corresponding number of components at the same time, transport them to the test head 5 and remove them again therefrom. It may be particularly expedient, in this case, to arrange the plungers 12 in a matrix on the circulating carriages 10, for example in the form of a 3×3, 2×4, 4×4 or 5×5 matrix.

The circulating carriages 10 are only partially shown in the figures in order to clear the view onto parts located therebehind or to increase the clarity. Furthermore, the circulating carriages 10 are not shown as such in the schematic view of FIG. 1, but merely associated drive arms 13 (the individual drive arms are designated 13a, 13b, 13c), which extend from the centre axis 11 radially outwardly to a respective circulating carriage 10 and drive the latter in the peripheral direction.

As indicated in FIG. 2, the circulating carriages 10 have a rectangular frame 14, on which a base plate 15, which is divided into two, is securely screwed. FIG. 2 only shows the circulating carriages 10 with one half of the base plate 15 to allow the view of the parts located therebehind. The base plate 15 is used, in particular, to fasten the plungers 12 and to radially inwardly seal the circulating carriages 10 in order to avoid heat losses in this direction if the components 43 are temperature-controlled inside the circulating carriages 10.

The releasable fastening of the base plate 15 on the frame 14 provides the advantage that the base plate 15 together with the plungers 12 can easily be replaced if, for example, an adaptation to another surrounding structure is required.

Figure 4:
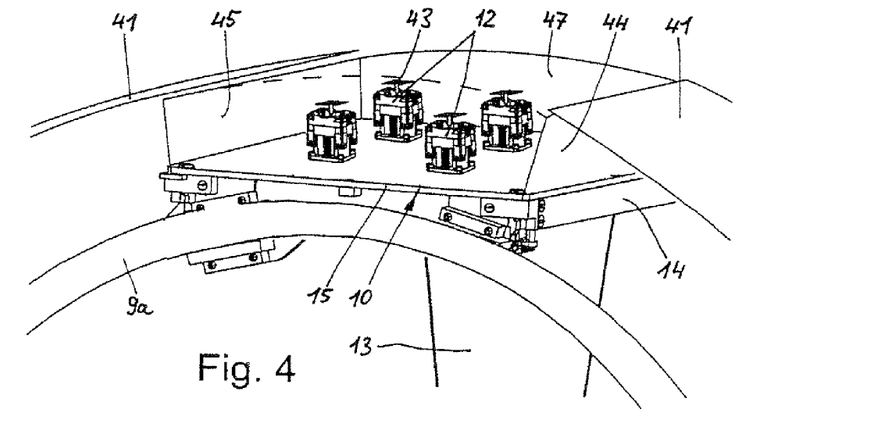
FIG. 4 shows a partially oblique sectional view of a circulating carriage of FIG. 3, four plungers being shown for the components.

As can be seen from FIG. 4, each circulating carriage 10 has a housing 48, consisting of the base plate 15, a front wall 44, a rear wall 45 and two side walls 46, 47. The walls 44 to 47, together with the level base plate 15, form a trough-like housing, which is at least substantially closed laterally and radially inwards, but is open radially outwards, i.e. at the top in FIG. 4. That part of the plungers 12 shown in FIG. 4 is located completely inside the housing 48. It is possible, with the aid of the housing 48, to configure each circulating carriage 10 as a circulating temperature-control chamber for the components 43.

So that the heat does not flow away radially outwards in an uncontrolled manner from the circulating carriages 10 when the temperature of the components 43 is being controlled, a peripheral cover 51 in form of a stationary, annular covering plate is arranged at a slight radial spacing outside the circulating carriage 10. The cover 51 covers the circulating carriages 10 over their entire circulating path with the exception of those regions in which the circulating carriages 10 are loaded with components 43, unloaded, and are pushed radially outwards in the direction of the test device. FIG. 4 shows the loading station, in which the cover plates are spaced apart from one another in the circulating direction to such an extent that the components 43 can be placed on the associated plungers 12 without hindrance. Each circulating carriage 10 can be made to rotate along the guides 9a, 9b by its own drive arm 13.

As can be seen from FIG. 2, each drive arm 13a, 13b, 13c is driven by its own drive mechanism in order to be able to move the circulating carriages 10, which are fastened to the radially outer end of an associated drive arm 13a, 13b, 13c, independently of one another. The drive aim 13a is driven by a drive motor 18a, by means of a toothed drive wheel 19a, a central toothed wheel 20a, a toothed belt 21a or an associated drive shaft. The drive arm 13b is driven by a drive motor 18b, by means of a toothed drive wheel 19b, a central toothed wheel 20b, a toothed belt 21b and an associated drive shaft. The drive arm 13c is driven by a drive motor 18c by means of a toothed drive wheel 19c, a central toothed wheel 20c, a toothed belt 21c and an associated drive shaft. The three drive shafts are arranged concentrically in one another about the common horizontal centre axis 11, two drive shafts being rotatable about the innermost drive shaft.

Figure 3:
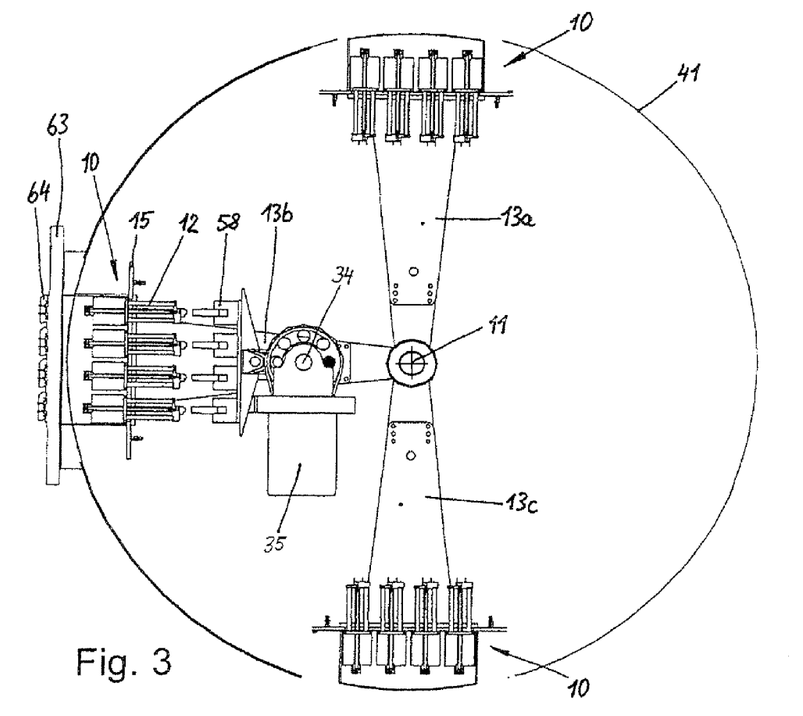
FIG. 3 shows a schematic side view of the handling device of FIG. 2 with the three circulating carriages and the advancing mechanism according to the invention.

Because of this arrangement, it is possible to rotate the circulating carriages 10 independently of one another about the centre axis 11 without a mutual rigid coupling, in order to approach various positions along the circulating path. FIGS. 2 and 3 in each case show a circulating carriage 10 in the upper loading position, in which the components 43 to be tested are placed on the plungers 12, in the lateral test position, in which the components are advanced horizontally and are contacted by the associated contacting devices (contact sockets) of the test head 5, and in the lower unloading position, in which the tested components 43 are removed from the plungers 12. In addition, the circulating carriages 10 may approach positions located in between, for example alignment and maintenance positions, wherein they are always rotated further stepwise in the same direction of rotation into the respective subsequent position or station.

In order to advance the components 43 to be tested in the lateral position of a circulating carriage 10 (the 9 o'clock position in FIG. 3) in a linear and horizontal manner in the direction of the test head 5 and to contact them with contact sockets, which are electrically connected to the test head 5, an advancing mechanism 30, only shown in FIGS. 3 and 5 to 10, is provided. This advancing mechanism 30, as can be seen from FIG. 3, is arranged in the region between the centre axis 11 and the plungers 12, which are located on the circulating carriage 10 located at the lateral test position.

Figure 5:
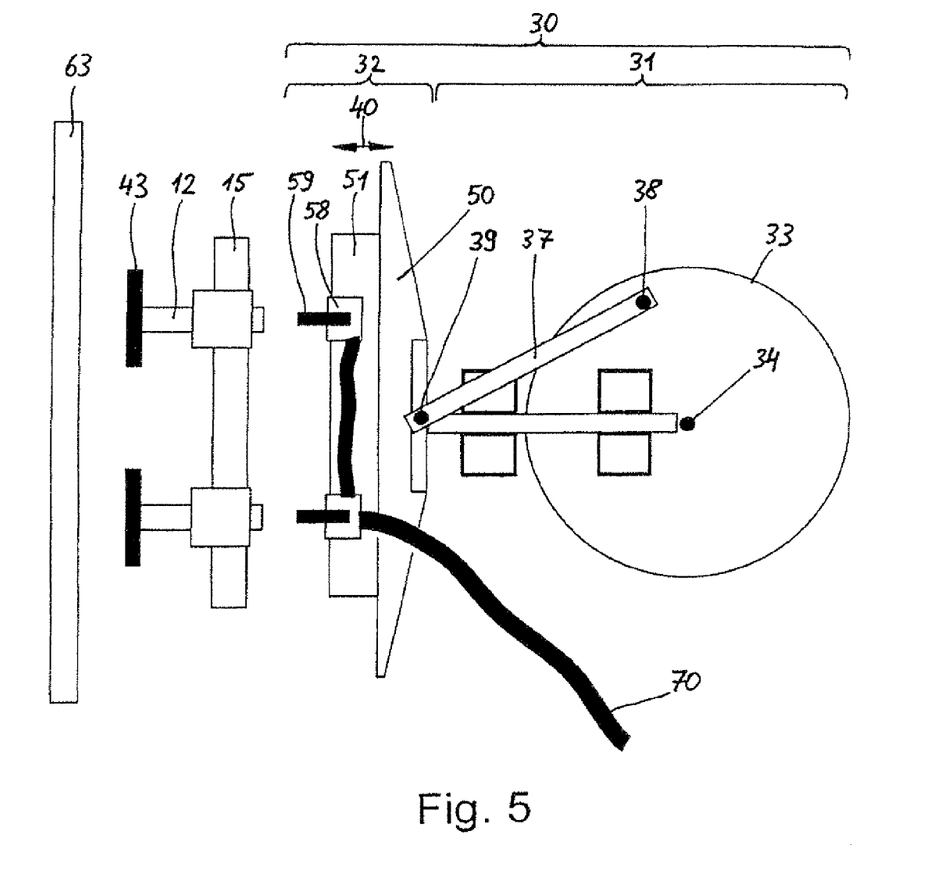
FIG. 5 shows a schematic side view of the advancing mechanism according to the invention.

As can be seen from the schematic view of FIG. 5, the advancing mechanism 30 has a pneumatic cylinder movement mechanism in the form of a crankshaft mechanism 31 and a pneumatic cylinder mechanism 32.

The crankshaft mechanism 31 comprises a crankshaft 33, which is configured as a toothed belt and can be rotated about a pivot pin 34 arranged parallel to the centre axis 11. The crankshaft 33 can be made to rotate by means of a drive mechanism 35 in the form of an electric motor, the electric motor being rotationally coupled by means of a toothed belt 36 to the crankshaft 33.

A connecting rod 37 is arranged, in each case, on either side of the crankshaft, the two connecting rods 37 being mounted eccentrically by their one end on the crankshaft 33 by means of a cross-bolt 38.

Figure 8:
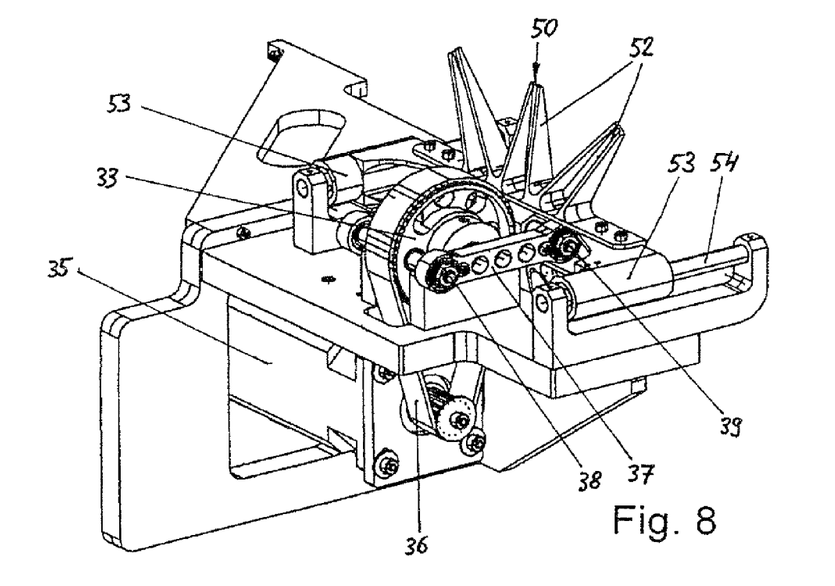
FIG. 8 shows a perspective view of a part of the advancing mechanism in the drawn-back position.
Figure 9:
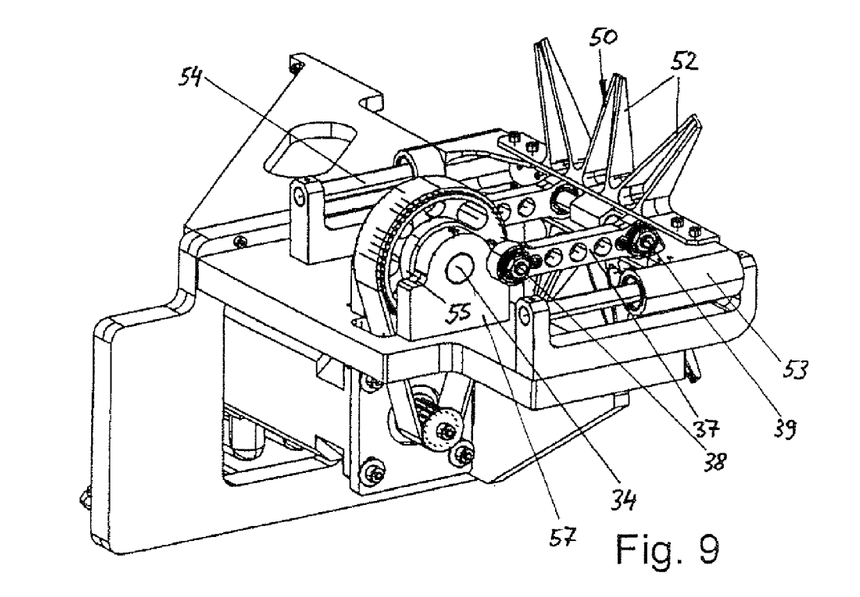
FIG. 9 shows a perspective view of the advancing mechanism of FIG. 8 in the front contact position.
Figure 10:
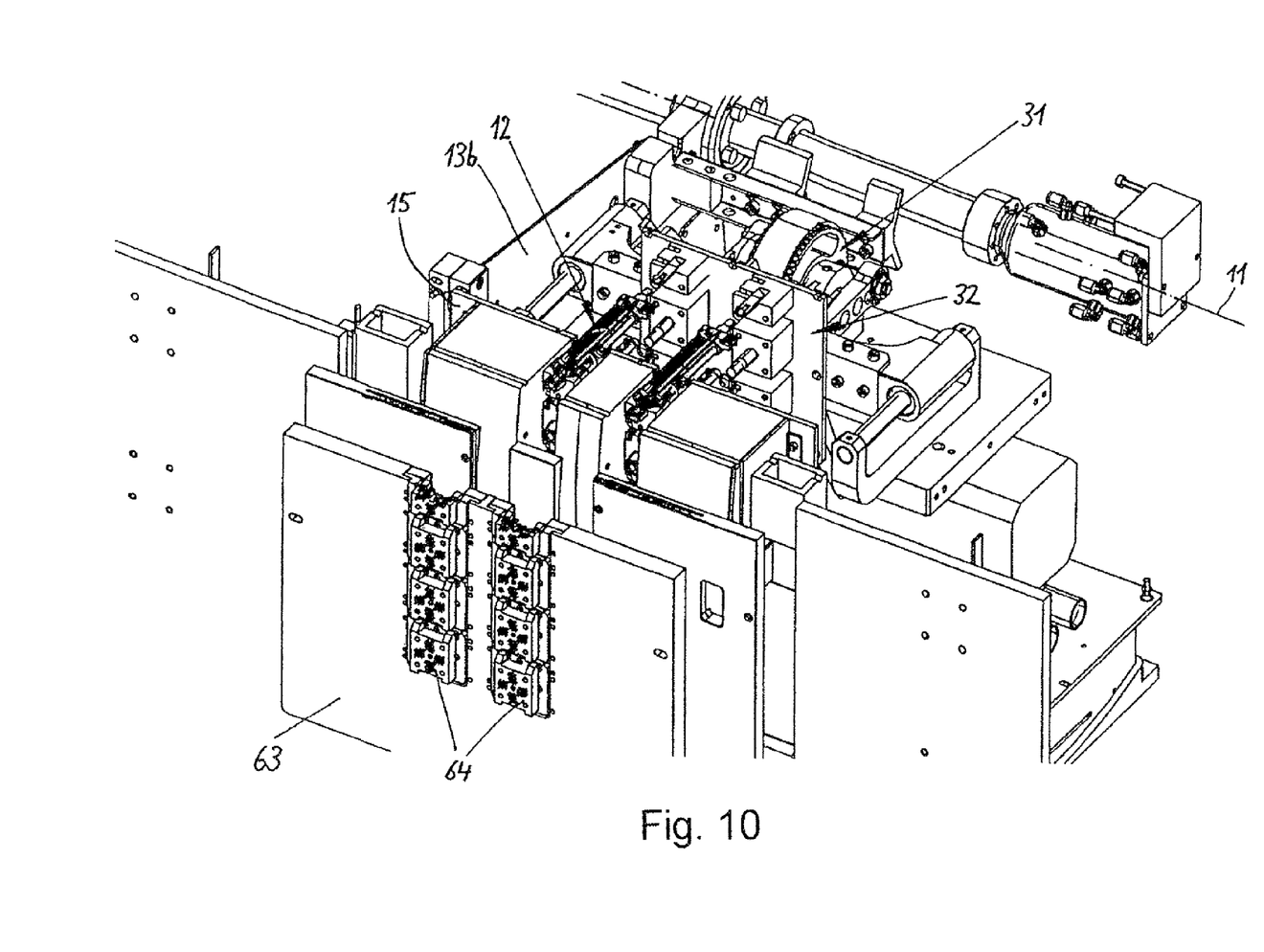
FIG. 10 shows a perspective view of parts of the handling device, the feed device, the transport unit and the contacting mechanisms from the side of the test device.

The two connecting rods 37 are pivotably mounted by their opposing end by means of a cross-bolt 39 on the plunger pressing mechanism 32, in order to displace the latter linearly horizontally, i.e. in the direction of the arrow 40 (FIG. 5), in that the crankshaft 33 is made to rotate. The pneumatic cylinder mechanism 32 has a plate carrier 50 and a holding plate 51 fastened thereto. The plate carrier 50 comprises a support part with individual fingers 52, on which the cylinder holding plate 51 is fastened, as well as guide sleeves 53 arranged on either side of the support part, with which guide sleeves the plate carrier 50 is displaceably mounted on stationary guide rods 54 (FIGS. 8, 9). If the crankshaft 33 is rotated from the position shown in FIG. 8, in which the cross-bolt 38 is located behind the pivot pin 34 relative to the plate carrier 50, through about 180° into the position shown in FIG. 9, in which the cross-bolt 38 is located between the pivot pin 34 and the plate carrier 50, the plate carrier 50 is thus linearly pushed by means of the two connecting rods 37 into the front position shown in FIG. 9. If the crankshaft 33 is rotated back from this position in the opposite direction into the starting position shown in FIG. 8, the plate carrier 50 is linearly drawn back in a corresponding manner. The rotational path of the crankshaft 33 is limited here by shoulders 55, 56 of bearing brackets 57, on which the pivot pin 34 is mounted, the cross-bolt 38 striking against the shoulders 55, 56 in the end positions.

The cylinder holding plate 51 is used for fastening a plurality of pneumatic cylinders 58, a pneumatic cylinder 58 opposing each plunger 12. The number of pneumatic cylinders 58 therefore expediently corresponds to the number of plungers 12.

Figure 6:
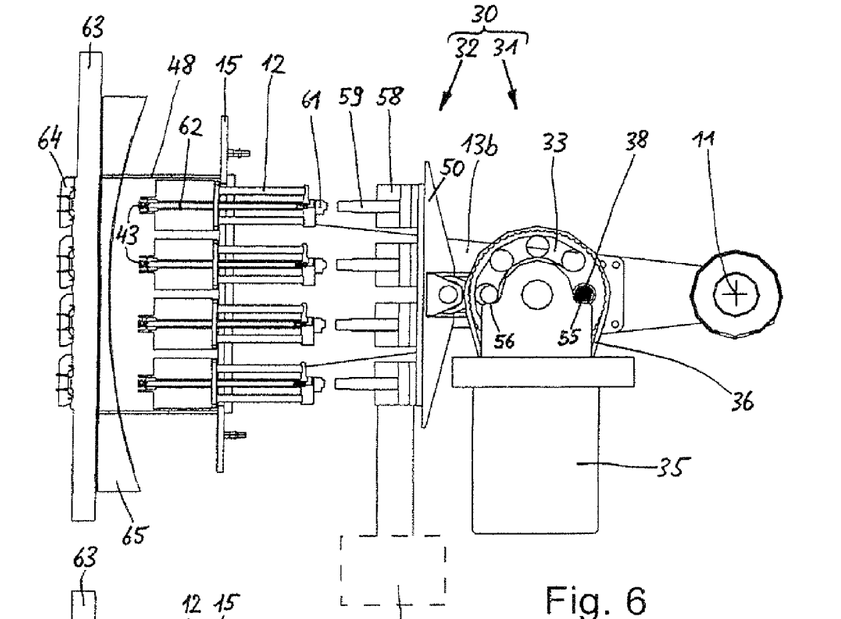
FIG. 6 shows a schematic side view of the advancing mechanism of FIG. 5 and of contacting mechanisms, the advancing mechanism being located in the drawn-back position.
Figure 7:
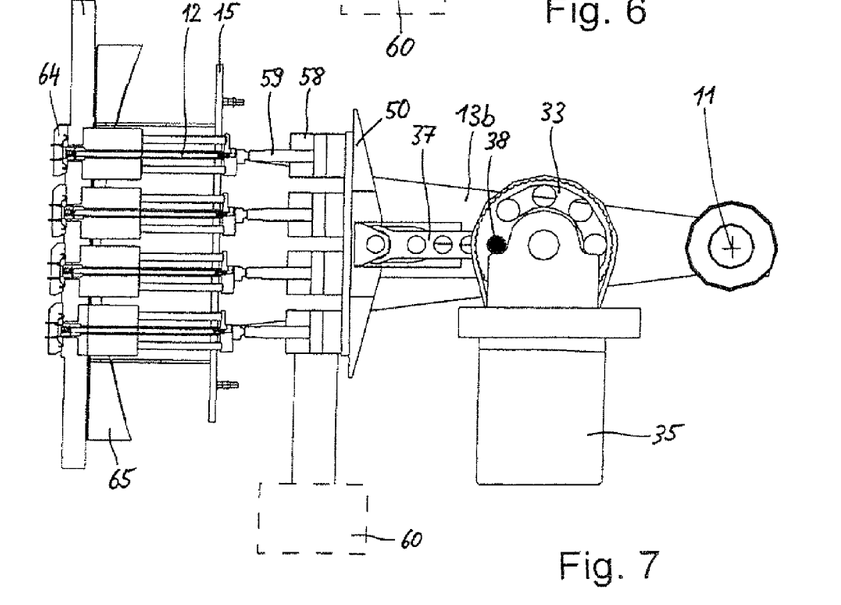
FIG. 7 shows a view corresponding to FIG. 6, the advancing mechanism being located in the advanced contact position.

The pneumatic cylinders 58 have piston rods 59, which are arranged in alignment with the plungers 12 and can be moved in the advancing direction (feed direction) out of the pneumatic cylinder 58, or can be moved into it. For this purpose, each pneumatic cylinder 58, as will be described in more detail below with the aid of FIGS. 5-7, is connected by corresponding pneumatic lines to a fluid supply mechanism 60 (see FIGS. 6 and 7). The pneumatic cylinders 58 are short-stroke cylinders.

The plungers 12 are held on the base plate 15 of the circulating carriages 10 so as to be displaceable in their longitudinal direction. For this purpose, the plungers 12 have a front portion, which, when the plungers are in the drawn-back state, shown in FIG. 6, is arranged inside the housing 48 of the circulating carriages 10, and a rear portion, which projects rearwardly, i.e. radially inwards inside the handling device 4, over the base plate 15. In this drawn-back position of the plungers 12, the circulating carriages 10 are brought into the lateral test position, which corresponds to the 9 o'clock position in FIG. 3. In the drawn-back position, the rear ends of the plungers 12, as can be seen from FIGS. 3 and 6, are spaced apart from the front ends of the piston rods 59 and completely separated therefrom, so the circulating carriages 10 can be moved into the test position without contacting the piston rods 59. In the test position, the piston rods 59 precisely oppose a rear end 61 of the plungers 12 (FIG. 6). In this position, the components 43, which are firmly sucked on the tip of a central tubular suction device 62 of the plungers 12, are drawn-back inside the housing 48 of the circulating carriages 10, the housing 48 having a slight spacing from a contact socket carrier 63 arranged on the tester side, so the relevant circulating carriage 10 can be moved in in the region between the contact socket carrier 63 and the pneumatic cylinders 58. The contact socket carrier 63 carries contact sockets 64 with contacts, with which the components 43 to be tested have to be brought into contact. Furthermore, an insulation 65 is also shown schematically in FIGS. 6 and 7 and prevents heat flowing away in an uncontrolled manner out of the housing 48 of the circulating carriages 10.

In order to be able to advance the components 43 from their drawn-back position shown in FIG. 6 into the advanced contact position shown in FIG. 7, the crankshaft 33 is rotated through approximately 180° in the anticlockwise direction, so the pneumatic cylinder mechanism 32 is moved in a linear manner in the direction of the contact sockets 64. The piston rods 59 of the pneumatic cylinders 58 press on the rear end 61 of the plungers 12 here and thereby push the plungers 12 accordingly forward into the contact position shown in FIG. 7. The piston rods 59 of the pneumatic cylinders 58 are moved out here by a predetermined amount. The position of the piston rods 59 relative to the pneumatic cylinders 58 can be maintained as long as no control intervention is necessary. It is therefore not necessary to retract the piston rod 59 after each test process and move it out again before each new test process. The individual pneumatic cylinders 58 can be activated individually, so that it is thus possible to activate individual pneumatic cylinders 58 or to deactivate them. Furthermore, the pneumatic cylinders 58 allow tolerances to be compensated during the contacting. If the positions of the contact sockets or the components differ from one another in the feed direction, the associated piston rods 59 are automatically pressed back to a greater or lesser degree, the contact pressure remaining substantially the same. Furthermore, it is possible with the aid of the pneumatic cylinders 58 to carry out a targeted selection between the contact sockets 64 to be contacted if, for example, some contact sockets 64 are not to be operated. In this case, the relevant piston rods 59 remain retracted, so the relevant plungers are not advanced to their contact end position.

The normal stroke path for feeding the plungers 12 from their drawn-back position into their front contact end position therefore takes place mechanically by means of the crankshaft mechanism 31, while the pneumatic cylinders 58 are only used for fine control and therefore for a uniform contact pressure of all the components 43 or for the targeted selection of individual plungers 12.

On ending the test process, the crankshaft 33 is again rotated back in the clockwise direction into the position shown in FIG. 6, whereby the pneumatic cylinder mechanism 32 is moved back into its drawn-back position. The plungers 12 are drawn back by a corresponding return spring, not shown, which is provided on each plunger 12, into their drawn-back position, in which the components 43 are again arranged inside the housing 48 and the plungers 12 are separated from the piston rods 59 of the pneumatic cylinders 58. The circulating carriage 10 can therefore be moved out of the test station so a following circulating carriage 10 with components 43 which have not yet been tested can be moved into the test position.

The advancing or draw-back speed of the advancing mechanism 30 changes because of the crankshaft mechanism 31 along the advancing path as a function of the angular position, which the bearing point, i.e. the cross-bolt 38, of the connecting rods 37 adopts on the crankshaft 33. As can be inferred from FIG. 5, the advancing speed in the 3 o'clock and 9 o'clock position of the cross-bolt 38, i.e. when the connecting line between the cross-bolt 38 and the cross-bolt 39 is parallel to the advancing direction, equals zero, while the advancing speed is highest when the cross-bolt 38 is located in the 12 o'clock position. A gentle placing of the components 43 on the associated contact sockets 64 can be achieved by the slowing down of the advancing speed on the approach of the cross-bolt 38 to the 9 o'clock position.

Figure 11:
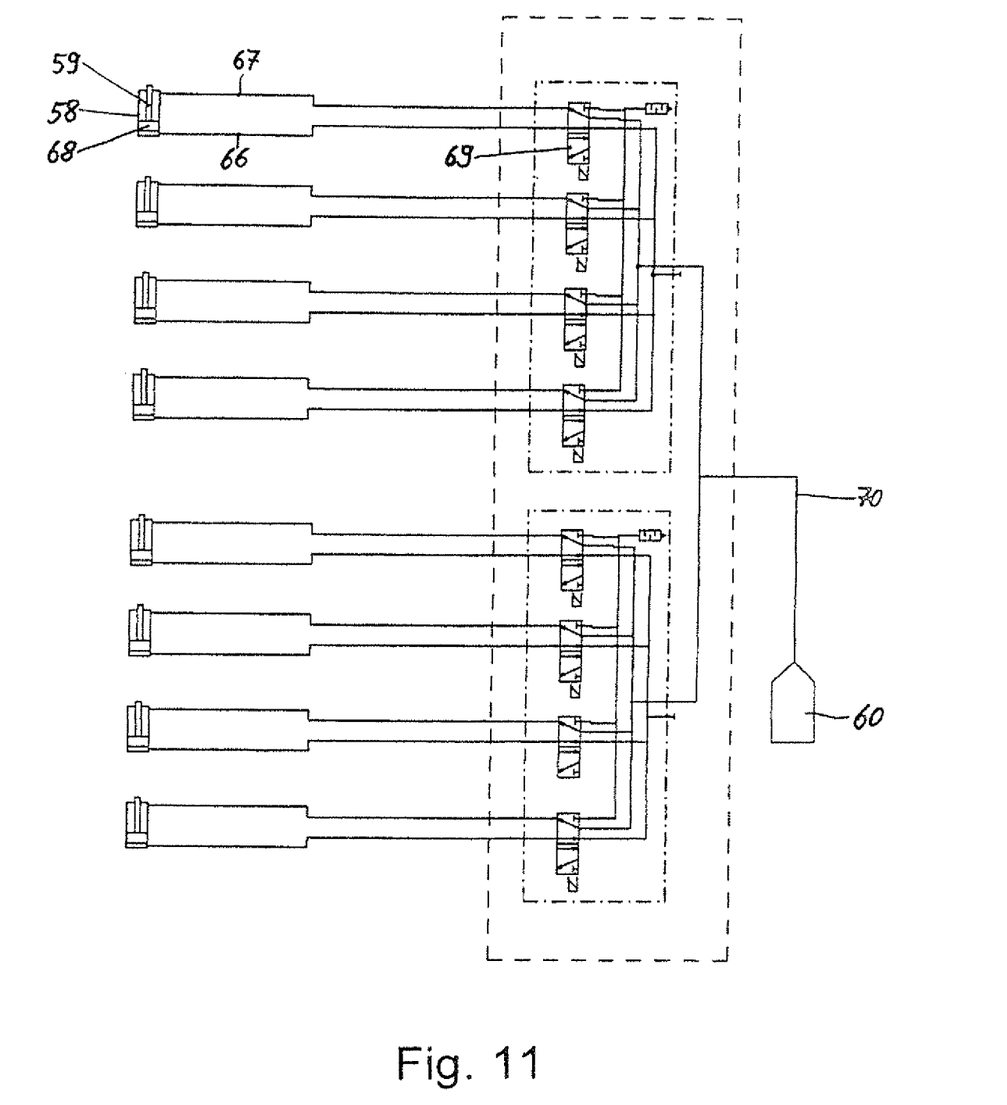
FIG. 11 shows a pneumatic circuit diagram to supply eight pneumatic cylinders.

FIG. 11 shows a pneumatic circuit diagram with eight pneumatic cylinders 58. Each pneumatic cylinder 58 is connected to the fluid supply mechanism 60 by means of a pneumatic line 66 and a second pneumatic line 67. The first pneumatic line 66 opens into the pneumatic cylinder 58 below a piston 68 and the second pneumatic line 67 opens above said piston. The pneumatic lines 66, 67 can be connected by means of electromagnetically actuable control valves 69 in the form of 5/2-way valves to a main supply line 70 leading to the fluid supply mechanism 60 or to suitable venting lines in such a way that the piston rods 59 are moved independently from one another out of the pneumatic cylinders 58, are moved therein or can be held in a specific position.

The first and second pneumatic lines 66, 67 are movable pressure lines, while the direction control valves 69 are arranged stationarily in the handling device 4.

The invention claimed is:
1. Handling device for contacting an electronic component to a contact socket electronically coupled to a test head of a tester, wherein the handling device comprises a plunger for holding the electronic component, the handling device further comprising:

a circulating carriage, a drive arm extending radially outwardly from a center axis to the circulating carriage, the plunger being fastened to the circulating so that the plunger is movable back and forth in its axial direction in a drawn-back position and radially outwards, an advancing mechanism having a pneumatic cylinder mechanism and a pneumatic cylinder movement mechanism in the form of a crankshaft mechanism, wherein the pnuematic cylinder mechanism has a pneumatic cylinder comprising a piston rod which is aligned with the plungers, wherein in the drawn-back position the rear end of the plunger is spaced apart from the front end of the piston rod, wherein the crankshaft mechanism is coupled to the pneumatic cylinder mechanism to displace the plungers in its axial direction so that the plungers is transferable from the drawn back position radially outwards into its front contact position, and wherein the piston rod of the pneumatic cylinder presses the rear end of the plungers forward in the contact position, exerting a contact pressure being controlled by the pneumatic cylinder.

2. Handling device according to claim 1, wherein the pneumatic cylinder movement mechanism crankshaft mechanism, comprises a drive mechanism, a crankshaft rotated by the drive mechanism, and at least one connecting rod, eccentrically mounted on the crankshaft, wherein the pneumatic cylinder mechanism is drivingly connected to the connecting rod which moves the pneumatic cylinder mechanism in the axial direction of the plungers.

3. Handling device according to claim 1, wherein the pneumatic cylinder mechanism comprises a plate carrier and a cylinder holding plate fastened thereto, the plate carrier being displaceably guided on a guide mechanism, which is stationarily arranged inside the handling device, and the pneumatic cylinders is fastened to the cylinder holding plate.

4. Handling device according to claim 1, wherein the pneumatic cylinders is arranged opposite the plunger.

5. Handling device according to claim 1, wherein the pneumatic cylinders is configured as short-stroke cylinders with the piston rods, which is resiliently insertably held in the cylinder housing under pneumatic pressure, the force for inserting the piston rod remaining substantially constant at least over an initial part of the insertion path.

6. Handling device for causing an electronic component to contact a contact socket electrically coupled to a tester test head, comprising:

a plunger configured to hold the electronic component, the plunger being operatively coupled to move reciprocally radially outwards from a drawn-back position to a contact position;

an advancing mechanism comprising a pneumatic cylinder and a crankshaft pneumatic cylinder movement mechanism, the pneumatic cylinder comprising a piston rod aligned with the plunger, the plunger being spaced apart from the piston rod when the plunger is moved to the drawn-back position;

the pneumatic cylinder being configured to move the plunger from the drawn-back position to the contact position;

the piston rod being configured to apply contact pressure to the electronic component through the plunger, the pneumatic cylinder controlling the contact pressure amount.

7. The handling device of claim 6 comprising a plurality of said plungers.

* * * * *